US009971800B2

(12) United States Patent
Sella et al.

(10) Patent No.: US 9,971,800 B2
(45) Date of Patent: May 15, 2018

(54) COMPRESSING INDICES IN A VIDEO STREAM

(71) Applicant: Cisco Technology, Inc., San Jose, CA (US)

(72) Inventors: Yaron Sella, Beit Nekofa (IL); Michal Devir, Haifa (IL); Harel Cain, Jerusalem (IL)

(73) Assignee: Cisco Technology, Inc., San Jose, CA (US)

( * ) Notice: Subject to any disclaimer, the term of this patent is extended or adjusted under 35 U.S.C. 154(b) by 239 days.

(21) Appl. No.: 15/096,297

(22) Filed: Apr. 12, 2016

(65) Prior Publication Data

US 2017/0293647 A1 Oct. 12, 2017

(51) Int. Cl.
*G06F 17/30* (2006.01)
*H04N 19/467* (2014.01)
*H03M 7/30* (2006.01)
*H03M 7/40* (2006.01)

(52) U.S. Cl.
CPC ........ *G06F 17/30336* (2013.01); *H03M 7/30* (2013.01); *H03M 7/3091* (2013.01); *H03M 7/3093* (2013.01); *H03M 7/4093* (2013.01); *H04N 19/467* (2014.11)

(58) Field of Classification Search
USPC ................ 707/687, 705, 790, 813, 821, 912
See application file for complete search history.

(56) References Cited

U.S. PATENT DOCUMENTS 8,023,513 B2 9/2011 Chen et al.
8,612,765 B2 12/2013 Moskowitz
8,750,254 B2 6/2014 Mosko et al.
9,137,010 B2 9/2015 Sella et al.
2014/0351582 A1* 11/2014 Barletta ................... G09C 1/00
　　　　　　　　　　　　　　　　　　　　713/159

(Continued)

FOREIGN PATENT DOCUMENTS

GB        2363027        12/2001
WO    WO 2012/007609    1/2012

OTHER PUBLICATIONS

International Search Report issued by the International Searching Authority dated Jun. 13, 2017 in a corresponding application (Application No. PCT/IB2017/051786).

(Continued)

*Primary Examiner* — Sana A Al-Hashemi
(74) *Attorney, Agent, or Firm* — Samuel M. Katz

(57) ABSTRACT

In one embodiment a system, apparatus, and method for optimizing index value lengths when indexing data items in an array of data items is described, the method including producing, at a first processor, an ordered series of index values, sending the ordered series of index values to an indexing processor, receiving, at the indexing processor, a data object including the array of data items, associating, at the indexing processor, a first part of one of the index values with a first one data item of the array of data items, associating, at the indexing processor, a second part of the one of the index values with a next one data item of the array of data items, repeating the steps of associating a first part of one of the index values and associating a second part of the one of the index values until all of the data items in the array of data items are indexed.

20 Claims, 7 Drawing Sheets

(56) References Cited

U.S. PATENT DOCUMENTS

| | | | | |
|---|---|---|---|---|
| 2015/0082399 A1* | 3/2015 | Wu | ..................... | G06F 21/6209 726/6 |
| 2015/0356353 A1* | 12/2015 | Vigouroux | .......... | G06F 17/3079 382/218 |
| 2017/0293647 A1* | 10/2017 | Sella | .................... | H04N 19/467 |

OTHER PUBLICATIONS

Chen, Jian-Wen et al; "Introduction to H.264 advanced video coding," Asia and South Pacific Conference on Design Automation, 2006.

Chroni, Maria et al.; "An Efficient Graph Codec System for Software Watermarking", IEEE 36th Conference on Computer Software and Applications Workshops, 2012.

Li, Jian et al.; "Reference Index-Based H.264 Video Watermarking Scheme" ; ACM Transaction on Multimedia Computing, Communications and Applications, vol. 8, No. S2, Article 33; Sep. 2012.

Gonzalez, Rol Blanco; "Index Compression for Information Retrieval Systems"; Jan. 1, 2008; University of A Coruna, Spain.

My Oracle Solutions; "Advantages-of-index-compression"; Nov. 9, 2015; available on the worldwide web at: http://psoug.org/blogs/mohan/about/advantages-of-index-compression/.

Battiato, S. et al; "A Color Reindexing Algorithm for Lossless Compression of Digital Images"; in Proceedings of the 17th Spring Conference on Computer Graphics (SCCG '01). IEEE Computer Society, Washington, DC. USA, 104; Apr. 25, 2001.

Hu, Shiyan; "Key-dependant decomposition based image watermarking"; in Proceedings of the 12th annual ACM international conference on Multimedia (Multimedia '04). ACM, New York, NY, USA, 428-431, DOI=http://dx.doi.org/10.1145/1027527.1027630; Oct. 10, 2004.

Iranpour, M.: "LSB-Based Steganography Using Hamiltonian Paths"; in Inteliigent Information Hiding and Multimedia Signal Processing. 2013 Ninth International Conference on , vol., No., pp. 586-569, Oct. 16-18, 2013.

Iranpour. M., et al; "A novel block-based steganographic method," in Computer and Knowledge Engineering (ICCKE), 2013 3th International eConference on , vol., No., pp. 167-172, Oct 31, 2013-Nov. 1, 2013.

* cited by examiner

COMPRESSING INDICES IN A VIDEO STREAM

TECHNICAL FIELD

The present disclosure generally relates to indexing of a stream of elements.

BACKGROUND

In the field of forensic watermarking, the ID of a potential traitor who might leak content is embedded in a content stream multiple times, and often it is desirable to encode the index of the ID-instance.

The term "index compression" may be used in the domain of information retrieval. In the context of information retrieval, index compression is understood to refer to compressing an index structure of a retrieval system, such as a database, where index compression is a technique used for enabling more-efficient data storage. In the present specification and claims, the term "index compression" is understood to be referring to a technique of compressing the actual index (as opposed to the database index structure), so that fewer bits and bytes are required for each index value used.

BRIEF DESCRIPTION OF THE DRAWINGS

The present disclosure will be understood and appreciated more fully from the following detailed description, taken in conjunction with the drawings in which.

The present invention will be understood and appreciated more fully from the following detailed description, taken in conjunction with the appendix in which:

Appendix A provides an exemplary Hamiltonian Path found in a directed graph with 64 nodes.

DESCRIPTION OF EXAMPLE EMBODIMENTS

Overview

A system, apparatus, and method for optimizing index value lengths when indexing data items in an array of data items is described, the method including producing, at a first processor, an ordered series of index values, the ordered series of index values including nodes of a Hamiltonian Path in a directed graph, sending the ordered series of index values to an indexing processor, receiving, at the indexing processor, a data object including the array of data items, associating, at the indexing processor, a first part of one of the index values with a first one data item of the array of data items, associating, at the indexing processor, a second part of the one of the index values with a next one data item of the array of data items, repeating the steps of associating a first part of one of the index values and associating a second part of one of the index values until all of the data items in the array of data items are indexed thereby forming an array of indexed data items, and outputting the data object including the array of indexed data items, wherein each of the first part of one of the index values and the second part of the one of the index values is used once for identifying the first one data item of the array of data items, and once for identifying a next data item of the array of data items.

Exemplary Embodiments

Figure 1:
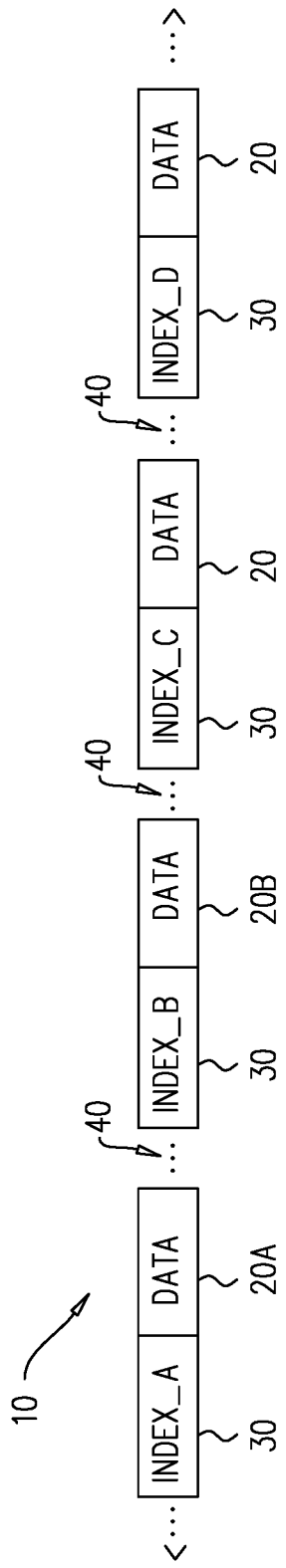
FIG. 1 is a simplified block diagram illustration of identifying data and indices constructed and operative in accordance with an embodiment of the present invention.

Reference is now made to FIG. 1, which is a simplified block diagram illustration of a stream 10 of indexed data items 20 showing the data items 20 and indices 30 associated with the data items, constructed and operative in accordance with an embodiment of the present invention. The stream 10 might also comprise additional non-indexed forms of data, which is disposed between the end of a first indexed data item 20 and the start of a second indexed data item 20. Accordingly, the stream 10 is depicted as having a space " . . . " 40 between data items, such as space 40 between data item 20A and ensuing index_B 30 of data item 20B.

Figure 2:
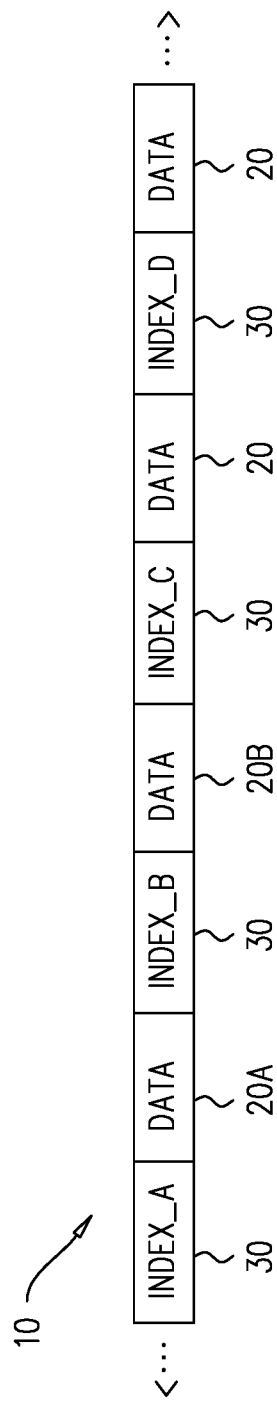
FIG. 2 is another view of the data stream and indices thereof of FIG. 1.

Due to the streaming nature of the data items 20, each data instance 20 is wrapped with two indices 30: one preceding it and one following it. Reference is now additionally made to FIG. 2, in order to better illustrate this point. FIG. 2 is another view of the data stream 10 and indices 30 thereof of FIG. 1. In FIG. 2, the data 20 is depicted so that each instance of the data 20 is surrounded by, on its left side, its own index 30, and on its right side, by the index 30 of the following data 20. The additional non-indexed forms of data are omitted from FIG. 2, since, being non-indexed, they may considered as transparent for the present discussion.

In a system where each data item 20 has its own index, the $j^{th}$ instance of the data items 20 may be marked with an array-like notation, DI[j], where DI indicates the data item 20. Using this notation enables depicting a full sequence of data bits embedded in the data stream as follows:

| Instance number | Indexed DI |
|---|---|
| 0 | DI[0] |
| 1 | DI[1] |
| . . . | . . . |
| j | DI[j] |

By way of example, the data items 20 may comprise watermarks in a video stream, serially numbered sections in a document, serially numbered production records coming from some production system (by way of a non-limiting example, the production of silicon chips), and so forth.

The number of DI-instances (i.e., j) that needs to be associated with indexed data items 20, embedded in the data stream 10 (regardless of whether this content item is video, a document, production records, etc.) implies that the number of bits that uniquely identifies each ID-instance is $\log_2(j)$. That is to say, referring to FIG. 1, that the number of bits needed to uniquely identify each instance of data 20 is $\log_2(j)$. More specifically, this implies that each index 30 of the plurality of indices 30 depicted in FIG. 1 should be at least log₂(j) bits in length in order to uniquely identify the ID data 40 with which it is associated. The value log₂(j) is hereinafter denoted as n, i.e. n=log₂(j). For example, if j is 256, then n=8, and 8-bits is the index size. Accordingly, each instance of the ID data 40 is preceded by n index bits.

Consider, in FIGS. 1 and 2, data item 20A. Data item 20A is preceded by INDEX_A 30 and followed by INDEX_B 30. It therefore becomes possible, by sharing the bits between matter, Index_A may be 9 bits; Index_B 42 bits; Index_C 9 bits, and so forth. Nevertheless, persons of skill in the art will appreciate that such non-typical arrangements, while feasible, are, in practice, cumbersome.

Figure 3:
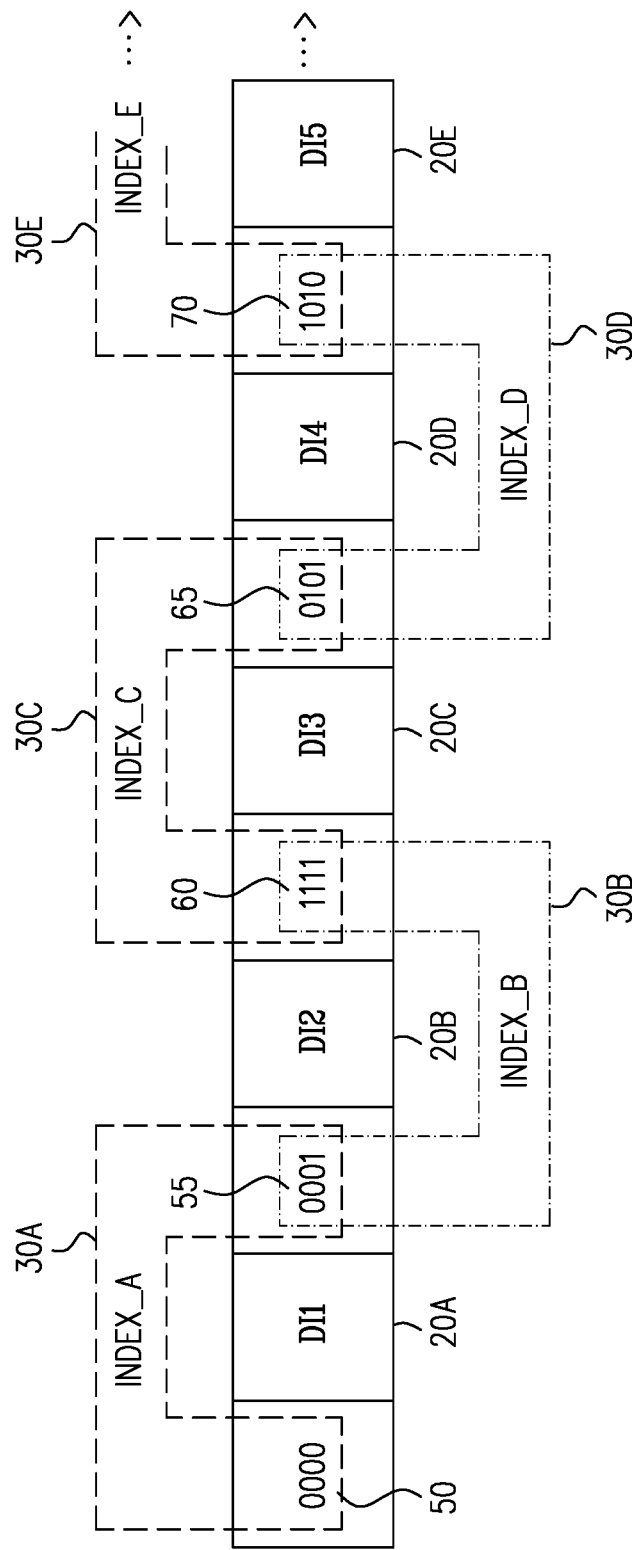
FIG. 3 is a simplified block diagram of an embodiment of FIG. 1.

Accordingly, FIG. 3 is described in Table 2, below. The abbreviations, msb (most significant bits), and lsb (least significant bits) are used in table 2 to refer, respectively, to the leftmost and rightmost bits of a given index value.

TABLE 2

| (FIG. 3 Block) | INDEX_ID_HALF Value msb | DATA ITEM | INDEX_ID_HALF lsb | VALUE | (FIG. 3 Block) |
|---|---|---|---|---|---|
| (50) | 0000 INDEX_A (30A) | DI1 (20A) | INDEX_A (30A) | 0001 | (55) |
| (55) | 0001 INDEX_B (30B) | DI2 (20B) | INDEX_B (30B) | 1111 | (60) |
| (60) | 1111 INDEX_C (30C) | DI3 (20C) | INDEX_D (30C) | 0101 | (65) |
| (65) | 0101 INDEX_D (30D) | DI4 (20D) | INDEX_D (30D) | 1010 | (70) |
| (70) | 1010 INDEX_E (30E) | DI5 (20D) | . . . | . . . | . . . | indices, to reduce by half the number of index bits preceding and following each ID data instance to n/2, and still have n index bits in very close proximity (in the stream) to the ID data instance. Each such instance of index bits is hereinafter referred to as a half-index.

Reference is now made to FIG. 3, which is a simplified block diagram of an embodiment of FIG. 1. Continuing the above discussion, by way of example, assume that each index is 8-bits in length. Then, if INDEX_A 30A is 00000001, the least significant nibble of INDEX_A 30A: 0001 (block 55) may be set to be the most significant nibble of INDEX_B 30B, as follows:

0000|DATA ITEM 20A|0001|DATA ITEM 20B

The least significant nibble 1111 (block 60) of INDEX_B 30B is set to be the most significant nibble 1111 (block 60) of INDEX_C, and so forth. Accordingly, the Table 1 provides an example for the first four instances of ID data:

TABLE 1

| Full Index | Data Item (DI) |
|---|---|
| 0000 0001 | DI1 |
| 0001 1111 | DI2 |
| 1111 0101 | DI3 |
| 0101 1010 | DI4 |
| 1010 . . . | DI5 |

Table 1 would, accordingly, be represented as the following exemplary data stream:

0000|DI1 0001 DI2 1111 DI3 0101 DI4 1010 DI5 . . .

Each half-index is used twice—the same instance of the half-index is used both once as a least significant "half" of a first index (e.g., INDEX_A 30A), and once as the most significant "half" of a second index (e.g., INDEX_B 30B). Thus, if the index is 1 byte long, each "half" will be a nibble. However, if the index is 256 bits long, then each "half" will be 128 bits. It is appreciated that since the half-index is referred to here as a least or most significant "half" because the size of each half of the index will vary with the size of the index. It is appreciated that using half-indices of equal length, and having the total length of the first half and the second half be a power of two in length is a convenience, but not a requirement. For example, Index_A may be 12 bits, Index_B 36 bits, Index_C 12 bits and so forth. For that Each of the two half-indices surrounding each instance of the data item 20 taken together comprise the full index which would have been used otherwise. Accordingly, in order to achieve precise identification of an instance of data item 20, each combination of preceding/following half-indexes pair will appear in the stream once, as is illustrated by Table 1 and the exemplary data stream following Table 1. It is appreciated that if each full index may be embedded only once, then each combination of preceding/following half-index pairs must appear in the stream exactly once. However, in embodiments where a full index value may be embedded more than once, then each paired instance of the first and second half of the full index which is used more than once will be used for each instance of the full index value used.

The constraint that the least significant half of the previous index is the most significant half of the following index may be modelled by constructing a directed graph G. Persons of skill in the art will appreciate that a "directed graph" is a set of objects referred to as "nodes" (also referred to as "vertices") that are connected together, where all of the edges are directed from one node to another. In our directed graph G, each node is labeled by a pair of two half-indexes. For example, for half-indexes in the range [0,3], the nodes are labeled: {0,0}, {0,1}, {0,2}, {0,3}, {1,0}, {1,1}, {1,2}, {1,3}, {2,0}, {2,1}, {2,2}, {2,3}, {3,0}, {3,1}, {3,2}, {3,3}. Edges in the directed graph G need to model the fact that each half-index is re-used twice, once as preceding an instance of ID data 20 and once as following another instance of ID data 20. Therefore, there exists a directed edge between nodes {a,b} and {c,d} if and only if b is equal to c. For example, there is a directed edge from {0,1} to {1,3}, but not between {1,2} and {3,2}. Persons of skill in the art will appreciate that any path in the directed graph G defined above will yield an array of full indices that are being used and can be split into half indices according to the constraint where the least significant half of the previous index is the most significant half of the following index. In embodiments where every full index is used exactly once then, in terms of the directed graph G defined above, the constraint translates to finding a Hamiltonian Path in G.

Generally, finding a Hamiltonian Path in an arbitrary graph is an NPC (NP-Complete) problem, meaning that it is very difficult to solve. Those of skill in the art will appreciate that a graph, such as directed graph G, is considered a complete graph if there is an edge between any two vertices of the graph. Finding a Hamiltonian Path for a complete graph is believed to be practically solvable—i.e., a solution can be computed in linear time.

In embodiments described herein, it is believed that finding the Hamiltonian path is easy in our embodiment for several reasons:

The size of the directed graph G is relatively small, and therefore, known techniques for finding the Hamiltonian path (such as DFS, described below) are relatively fast. By way of example, in a streaming video which has been forensically watermarked (see FIG. 6, below), the directed graph G is relatively small in the context of the streaming video. Consider a typical movie of two hour duration. If each index instance requires 10 minutes of video to embed, then the total number of index instances would be 120 minutes per instance/10 instances=12 instances.

The Hamiltonian path need not be found in real time during the embedding of the index 30 but rather, the Hamiltonian path may be found before embedding, and provided to the embedder, as will be discussed below, with reference to FIG. 4. The directed graph G is highly regular and is built in a special layered structure. As a result, there is a Hamiltonian path in the directed graph G which is also very regular, and the Hamiltonian path can be computed in linear time (i.e., easily).

For the directed graphs G for the embodiments described herein, a recursive Depth-First Search (DFS) typically will find the Hamiltonian Path very quickly. Tests performed by the inventors have given results of less than 1 second, on non-optimized code. As is known in the art, DFS is a method for searching graph data structures. In the case of directed graph G, an arbitrary node is selected as a root, and the method explores as far as possible without backtracking. The inventors have noted that the first solution is found with very little backtracking in the DFS. Furthermore, due to the high regularity of the graphs, the Hamiltonian Path found is also very regular. Appendix A describes an exemplary Hamiltonian Path in a directed graph with 64 nodes.

It is appreciated that other appropriate methods known in the art to find an appropriate Hamiltonian Path for directed graph G may be used to produce the half index values. For example, and without limiting the generality of the foregoing, the DFS processor may comprise a non-recursive DFS processor. Other non-DFS processors for determining a Hamiltonian Path in the directed graph G may also be used. Alternatively, other techniques known in the art, such as iterative deepening depth first search (IDDFS), lexicographic breadth first search (LBFS), or breadth-first search (BFS), or any other appropriate method may be used to traverse the directed graph G and produce the half index values.

Figure 4:
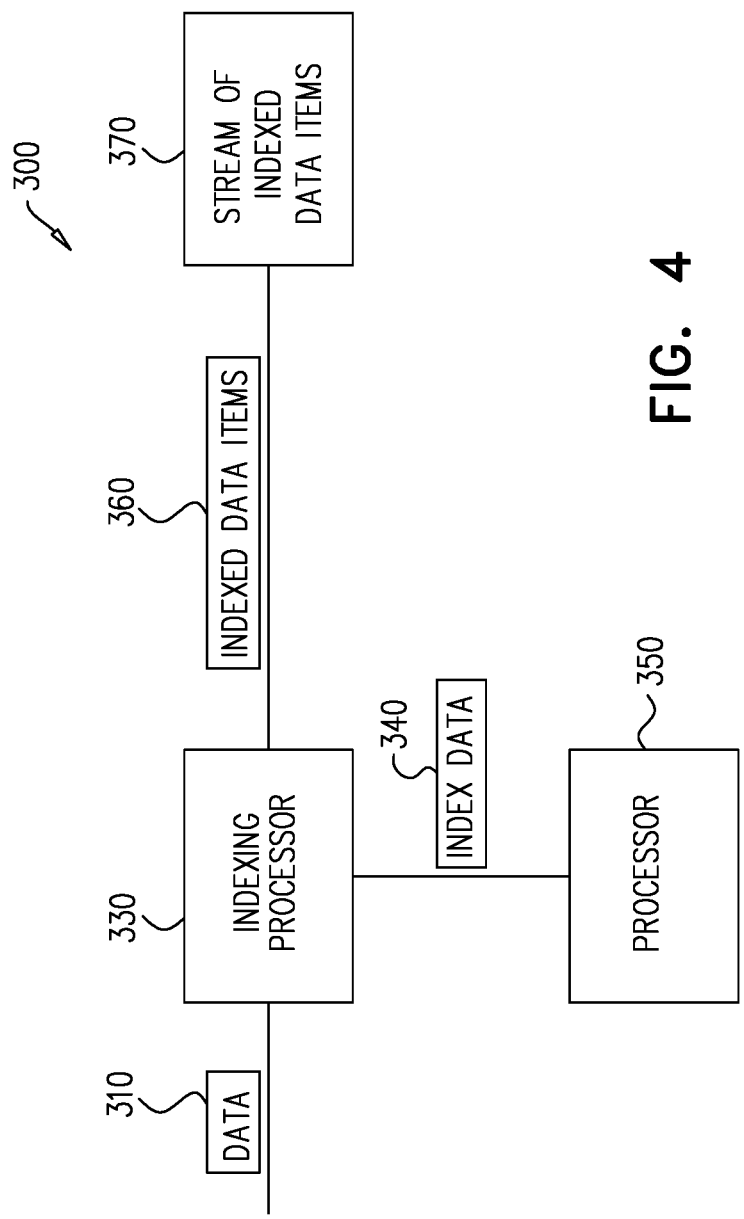
FIG. 4 a simplified block diagram illustration of a system for embedding the indices of FIG. 1.

Reference is now made to FIG. 4, which is a simplified block diagram illustration of a system 300 for embedding the indices of FIG. 1. Data 310 is input into an indexing and embedding processor 330. As noted above, the data 20 (FIG. 1) may be any appropriate data which can be represented as a stream of indexed data, such as the stream 10 of data of FIGS. 1 and 2. The indexing and embedding processor 330 receives index data 340, and associates each individual index data item with a data item 20. It is appreciated that the associating of the individual received index data items and the data items 30 (FIG. 1) is performed according to the directed graph G, as discussed above, by way of example, in Table 1 (or in any other appropriate sequence as determined when determining the Hamiltonian Path of directed graph G).

It is appreciated that indexing of the data 20 (FIG. 1) using the method and systems described herein places significant constraints on the indexer. While using full indices, in a typical system, there is no particular constraint on the order of the index values. Thus, when using j index values, there are j! possible orders of the index values. However, when using half index values as in the embodiment described herein, the order of the index values is necessarily constrained. By way of example, a regular counting order, i.e. 1, 2, 3, . . . is not a possible order of index values.

The index data items 340 are determined and provided to the indexing and embedding processor 330 by an index value processor 350. The index value processor 350 may comprise a DFS processor as described above. Alternatively, the index value processor 350 may comprise a processor which runs IDDFS, LBFS, BFS, or any other appropriate method in order to produce the index data 340 which are supplied to the indexing and embedding processor 330.

Indexed data items 360, comprising the least and most significant halves of the index data 340 sandwiching the data 310 to be indexed is output by the indexing and embedding processor 330, and a stream of indexed data items 370 is produced.

Figure 5:
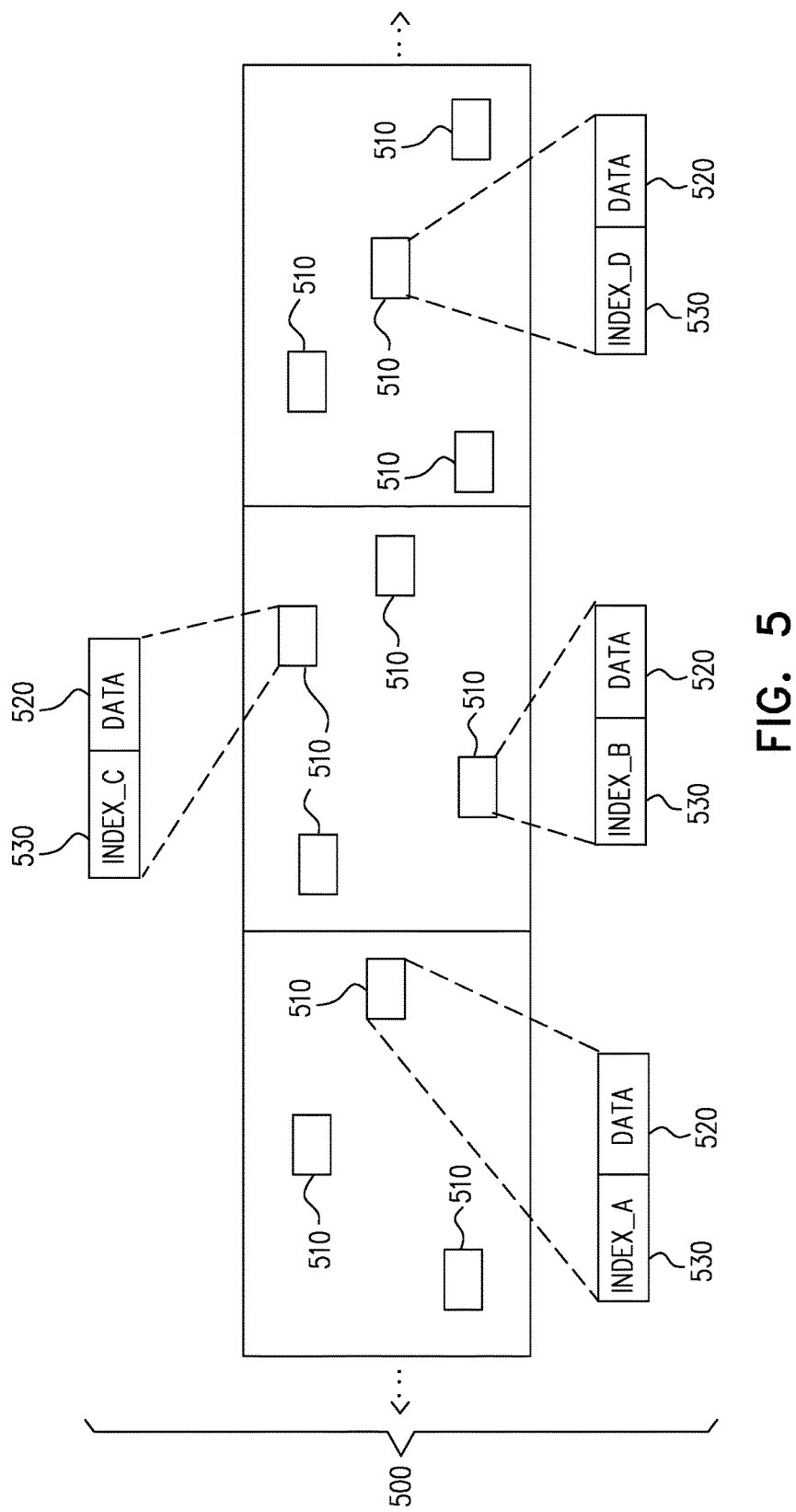
FIG. 5 is an exemplary embodiment of the system of FIG. 1 where the embedded indices are used for indexing watermarks in a plurality of watermarked streamed video frames.

Reference is now made to FIG. 5, which is an exemplary embodiment of the system of FIG. 1 where the embedded indices, such as indices 50, 60, and 70 of FIG. 3) are used in a plurality of watermarked streamed video frames 500 for indexing watermarks 510. The watermarks 510 are used to embed data 520 into content, such as video content in a pay television system. The watermark data 520 can be used forensically, for example, to identify which legitimate subscriber of a pay TV service is leaking the stolen video content, and, for example, streaming the stolen video content online. By way of example, watermark data 520 may include forensic information which uniquely identifies a subscriber or equipment associated with a particular subscriber, such as, but not limited to, a subscriber ID, a smart card ID, and a set top box ID, etc.

In streams of video frames 500, watermarks 510 should be such as to enable stand-alone detection (i.e. without any need to consult a database of metadata). In order to achieve stand-alone detection of the watermarks 510, typically, watermarks 510 comprise an index 530 embedded along with of each instance of the watermark data 520. In embodiments described herein, the index 530 is used to correctly parse (and, when required, decrypt) its associated instance of the watermark data 520.

In keeping with the method and system described above, and referring additionally to FIG. 3, INDEX_A 530 comprises two halves. The most significant half of INDEX_A 530 would correspond, in FIG. 3, to INDEX_A FIRST HALF 50. INDEX_A FIRST HALF 50 is then followed by watermark data 520. The watermark data 520 is then followed by INDEX_A SECOND HALF 60 (FIG. 3), which is the same value as INDEX_B FIRST HALF 60 (FIG. 3). The half index value of the index 60 is then followed by watermark data 520. This rubric is followed until all of the watermark data 520 is indexed. It is appreciated that the last index value at the very end of the video stream 510 may require a full index value.

Figure 6:
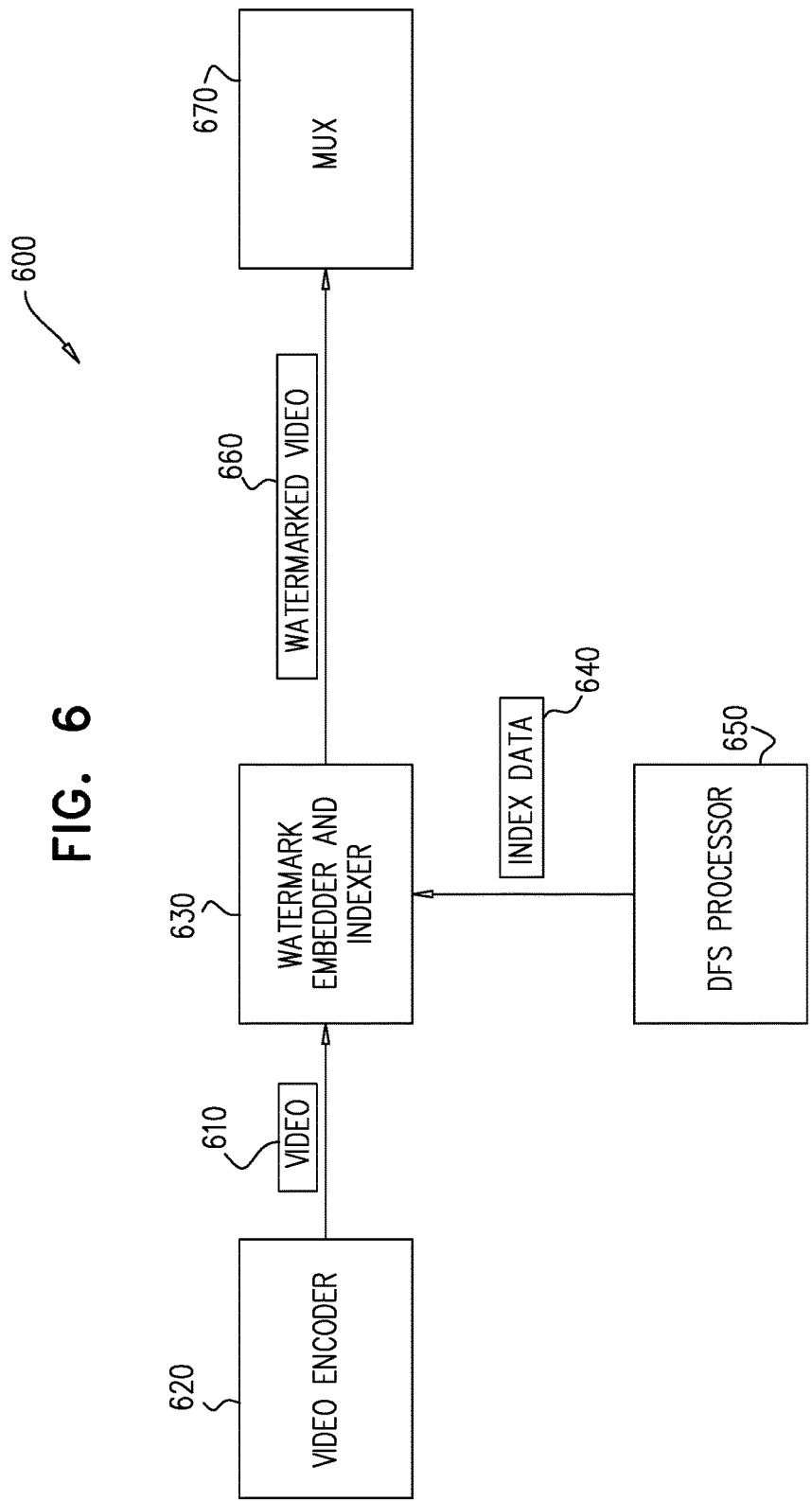
FIG. 6 is an exemplary embodiment of a system for embedding the indices of FIG. 4.

Reference is now made to FIG. 6, which is a simplified block diagram illustration of a system 600 for embedding the watermark indices of FIG. 5. Encoded video 610 is output by a video encoder 620. The video encoder may be an H.264 video encoder, an H.265 video encoder, an MPEG 2 video encoder, or any other appropriate type of video encoder. The encoded video 610 is received at a watermark embedder and indexer 630. The watermark embedder and indexer 630 embeds watermark data (such as the data 520, FIG. 5) in the received encoded video 610. The watermark embedder and indexer 630 also embeds a watermark index, such as index 530 (FIG. 5), associated with each watermark. It is appreciated that any appropriate watermark technique may be used, including color watermarks, luminance watermarks, visible watermarks, hidden watermarks, and so forth.

It is appreciated that the steps of embedding the watermark data in the received encoded video 510 and associating the embedded watermark data with index values corresponding to index values 30 of FIGS. 1-3 may be performed separately and by different processors. However, for the ease of depiction, these steps are depicted together in FIG. 6.

Figure 7:
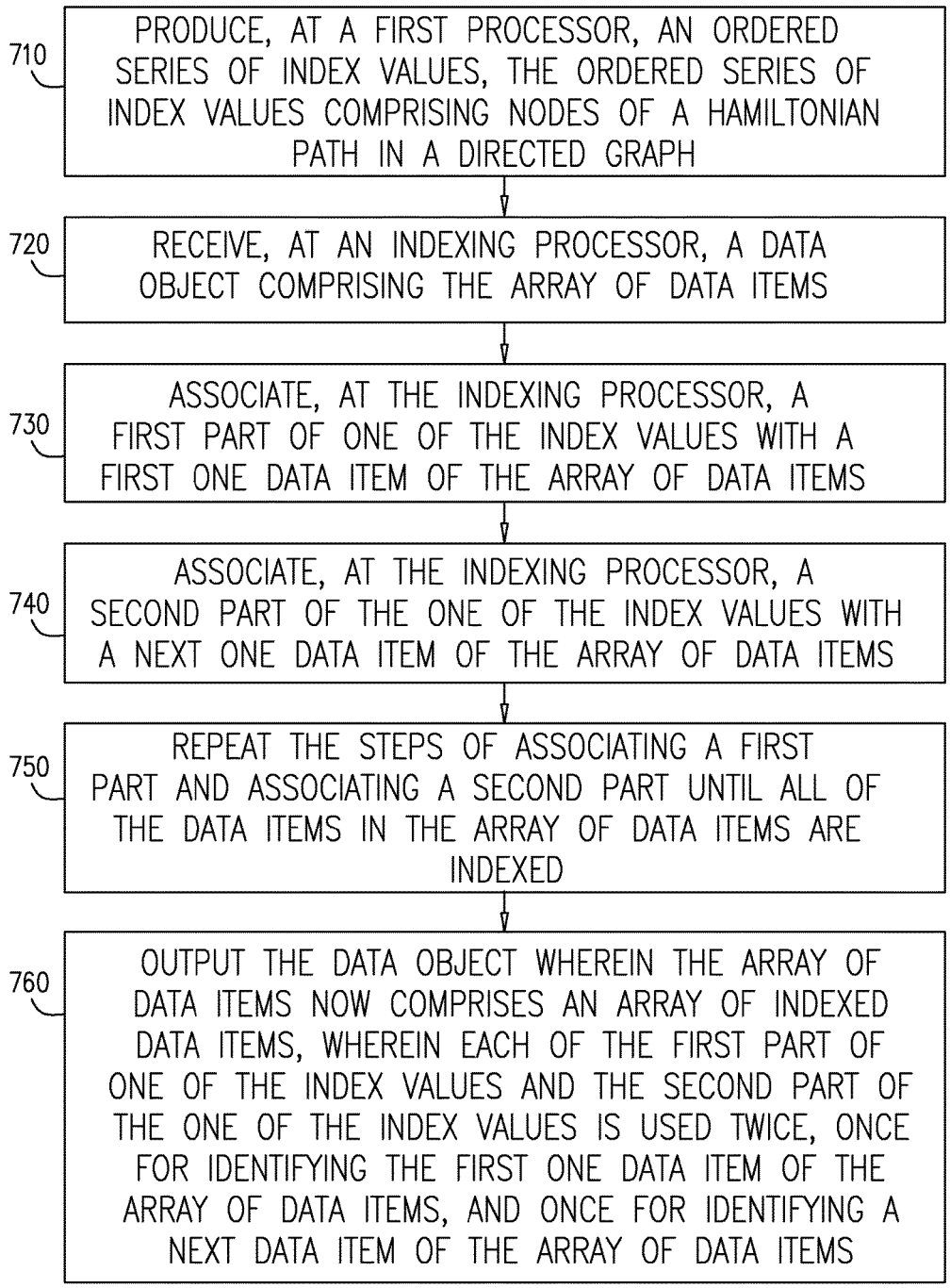
FIG. 7 is a simplified flowchart diagram of a method for producing the plurality of watermarked streamed video frames of FIG. 1.

Reference is now made to FIG. 7, which is a simplified flowchart diagram of a method for producing the plurality of watermarked streamed video frames of FIG. 1. A first processor, such as processor 350 (FIG. 3), produces an ordered series of index values comprising nodes of a Hamiltonian path in a directed graph (block 710). An indexing processor, such as indexing processor 330 (FIG. 3), receives a data object comprising the array of data items such as data 310 (FIG. 3) (block 720). The indexing processor, such as indexing processor 330 (FIG. 3), associates a first part of one of the index values with a first one data item of the array of data items such as data 310 (FIG. 3) (block 730). The indexing processor, such as indexing processor 330 (FIG. 3), associates a second part of the one of the index values with a next one data item of the array of data items such as data 310 (FIG. 3) (block 740). The steps of associating a first part and associating a second part are repeated by the indexing processor, such as indexing processor 330 (FIG. 3), until all of the data items in the array of data items, such as data 310 (FIG. 3), are indexed (block 750). The data object is outputted, wherein the array of data items now comprises an array of indexed data items, such as indexed data items 360 of FIG. 3 (block 760).

An exemplary Hamiltonian Path found in a directed graph with 64 nodes:

[(0, 0), (0, 1), (1, 0), (0, 2), (2, 0), (0, 3), (3, 0), (0, 4), (4, 0), (0, 5), (5, 0), (0, 6), (6, 0), (0, 7), (7, 1), (1, 1), (1, 2), (2, 1), (1, 3), (3, 1), (1, 4), (4, 1), (1, 5), (5, 1), (1, 6), (6, 1), (1, 7), (7, 2), (2, 2), (2, 3), (3, 2), (2, 4), (4, 2), (2, 5), (5, 2), (2, 6), (6, 2), (2, 7), (7, 3), (3, 3), (3, 4), (4, 3), (3, 5), (5, 3), (3, 6), (6, 3), (3, 7), (7, 4), (4, 4), (4, 5), (5, 4), (4, 6), (6, 4), (4, 7), (7, 5), (5, 5), (5, 6), (6, 5), (5, 7), (7, 6), (6, 6), (6, 7), (7, 7), (7, 0)]

Figure 8:
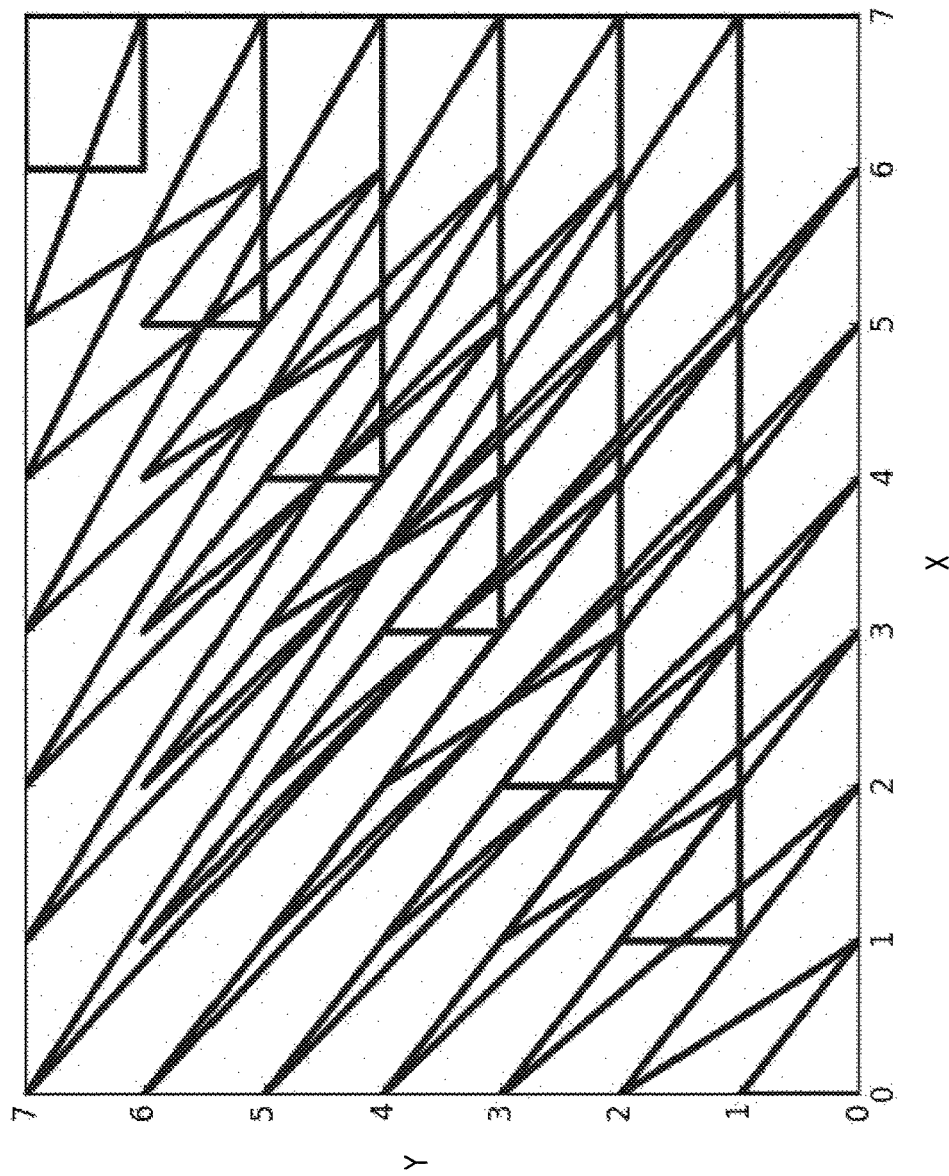
FIG. 8 is a graphic representation of the line taken by the Hamiltonian Path of Appendix A.

Reference is now made to FIG. 8, which is a graphic representation of the line taken by the Hamiltonian Path of Appendix A. In FIG. 8, the path which the line takes represents the Hamiltonian path. Accordingly, the path starts (0, 0), (0, 1), (1, 0), (0, 2), (2, 0), (0, 3), (3, 0), (0, 4), (4, 0), (0, 5) . . . .

What is claimed is:

1. A method for optimizing index value lengths when indexing data items in an array of data items, the method comprising:

producing, at a first processor, an ordered series of index values, the ordered series of index values comprising nodes of a Hamiltonian Path in a directed graph;

sending the ordered series of index values to an indexing processor;

receiving, at the indexing processor, a data object comprising the array of data items;

associating, at the indexing processor, a first part of one of the index values with a first one data item of the array of data items;

associating, at the indexing processor, a second part of the one of the index values with a next one data item of the array of data items;

repeating the steps of associating a first part of one of the index values and associating a second part of the one of the index values until all of the data items in the array of data items are indexed thereby forming an array of indexed data items; and outputting the data object comprising the array of indexed data items, wherein each of the first part of one of the index values and the second part of the one of the index values is used once for identifying the first one data item of the array of data items, and once for identifying a next data item of the array of data items.

2. The method according to claim 1 wherein the data object comprises an encoded video.

3. The method according to claim 2 wherein the array of data items comprises an array of video watermarks in the encoded video.

4. The method according to claim 3 wherein the array of watermarks comprises forensic watermarks.

5. The method according to claim 1 wherein the first processor comprises a DFS processor.

6. The method according to claim 1 wherein the DFS processor comprises a recursive DFS processor.

7. The method according to claim 1 wherein the DFS processor comprises a non-recursive DFS processor.

8. The method according to claim 1 wherein the first processor comprises an iterative deepening depth first search (IDDFS) processor.

9. The method according to claim 1 wherein the first processor comprises a lexicographic breadth first search (LBFS) processor.

10. The method according to claim 1 wherein the first processor comprises a breadth-first search (BFS) processor.

11. The method according to claim 1 wherein the data object comprises a document.

12. The method according to claim 11 wherein the array of data items comprises serially numbered sections in the document.

13. The method according to claim 1 wherein the data object comprises production records.

14. The method according to claim 13 wherein the array of data items comprises indices pertaining to the production records.

15. The method according to claim 13 wherein the production records are records from production of silicon chips.

16. The method according to claim 1 wherein the first part of one of the index values is equal in length to the second part of the one of the index values.

17. The method according to claim 1 wherein a total length of the first part of one of the index values and the second part of the one of the index values is a power of two in length.

18. A system for optimizing index value lengths when indexing data items in an array of data items, the system comprising:

a first processor configured to produce an ordered series of index values, the ordered series of index values comprising nodes of a Hamiltonian Path in a directed graph;

the first processor further configured to send the ordered series of index values to an indexing processor;

the indexing processor configured to receive a data object comprising the array of data items;

the indexing processor further configured to associate a first part of one of the index values with a first one data item of the array of data items;

the indexing processor still further configured to associate a second part of the one of the index values with a next one data item of the array of data items;

the indexing processor yet further configured to repeatedly associate a first part of one of the index values and associate a second part of the one of the index values until all of the data items in the array of data items are indexed thereby forming an array of indexed data items; and the indexing processor configured to output the data object comprising the array of indexed data items, wherein each of the first part of one of the index values and the second part of the one of the index values is used once for identifying the first one data item of the array of data items, and once for identifying a next data item of the array of data items.

19. The system according to claim 18 wherein the first part of one of the index values is equal in length to the second part of the one of the index values.

20. The system according to claim 18 wherein a total length of the first part of one of the index values and the second part of the one of the index values is a power of two in length.

* * * * *